May 23, 1967 R. LYON-CAEN 3,321,716

THERMALLY COUPLED ELECTRONIC CIRCUITS

Filed March 11, 1966 2 Sheets-Sheet 1

May 23, 1967 R. LYON-CAEN 3,321,716

THERMALLY COUPLED ELECTRONIC CIRCUITS

Filed March 11, 1966 2 Sheets-Sheet 2

United States Patent Office 3,321,716

Patented May 23, 1967

3,321,716

THERMALLY COUPLED ELECTRONIC CIRCUITS

Robert Lyon-Caen, Bry-sur-Marne, France, assignor to Compagnie Francaise Thomson Houston-Hotchkiss Brandt, Paris, France, a corporation of France Filed Mar. 11, 1966, Ser. No. 533,490
Claims priority, application France, Mar. 16, 1965, 9,367
12 Claims. (Cl. 331—113)

This invention relates to electronic circuits utilizing heat transfer as the means for coupling energy between different parts thereof. The invention is especially directed to the provision of improved low-frequency periodic-signal generators in which the positive feedback of energy from the output to the input of the generator includes a thermal link.

In recent years the integrated-circuit and related microelectronic techniques have enormously reduced the size and cost of electronic equipment while greatly increasing reliability. A typical integrated circuit may include as may as 16 transistors and 32 resistors formed on a silicon single-crystal wafer 2 millimeters by 2.5 millimeters in size. The small size and close packing of the individual circuit components made possible by present-day fabrication techniques is eminently suitable for high and ultra-high frequency work where the time required for the propagation of electromagnetic energy sets an upper limit to the rates of response achievable. There are many individual instances, however, where the generation of low and very low frequency signals is required for some specific purpose even in connection with ultra-high frequency systems, or other systems in which the use of integrated circuits would per se be very desirable.

Heretofore, the circuits used in the generation of low and very low frequency signals have generally been based on the charge and discharge of capacitors through resistors (as in relaxation oscillators and multivibrators), and since the time constant of any such circuit is proportional to resistance times capacitance, it is evident that the lower the signal frequency desired, the larger will be the physical size of the resistors and capacitors to be provided. The difficulty is especially great in regard to the physical size of the capacitors required, which is generally quite inconsistent with the minute dimensions of an integrated circuit.

It is an object of this invention to provide a low-frequency oscillator whose operating principle will not be based on capacitance action and wherein, consequently, capacitance will not set a limit to circuit miniaturization where this is desired. An object is to provide improved oscillator circuits in which thermal coupling is used as the positive feedback link from the output to the input of the circuit. An object is to provide an operative combination of a two-state switching or bistable circuit with thermal coupling means for the production of low-frequency oscillations. An object is to take advantage of the inherent temperature-instability of balanced differential amplifier circuits, in order to provide an efficient low-frequency oscillator. Further objects include the provision of improved thermal coupling units for electronic circuits in the form of semi-conductive single-crystal wafers and the provision of integrated circuits embodying such thermal coupling units.

The invention in an important aspect comprises a two-state switching circuit and thermal coupling means so interconnected in a feedback loop from the output to the input of said circuit that the circuit will be switched to its alternate stable states in time with the heating and cooling of said thermal coupling means.

I am aware of prior-art proposals to use thermal coupling means in electronic circuits as time delay relays and integrators. To the best of my knowledge, thermal-coupled low-frequency oscillators have not heretofore been suggested.

Exemplary embodiments of the invention will now be described with reference to the accompanying drawings, wherein.

Figure 1:
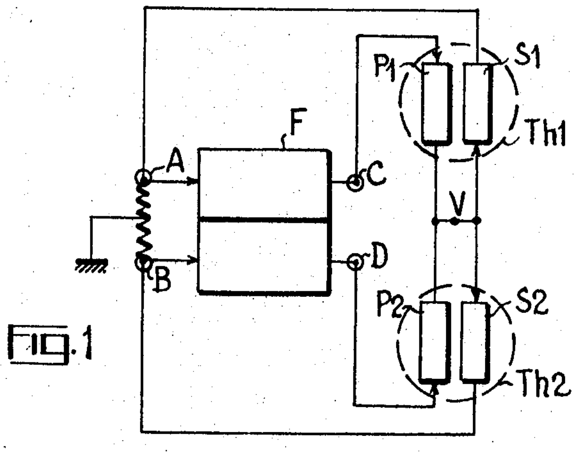
FIG. 1 is a schematic diagram of a first embodiment of the present invention.

The low-frequency oscillator shown in FIG. 1 includes a bistable circuit or flipflop schematically indicated at F, which may be of various suitable types one example of which will be described later. The bistable circuit F has two inputs A and B and two outputs C and D, and it is here assumed that the application of an energizing voltage to input A switches the circuit to a first stable state in which output C is energized and output D deenergized, and that subsequent application of an energizing voltage to input B switches the circuit to its reverse state where output C is deenergized and output D energized.

Associated with bistable circuit F is a pair of similar thermal coupling units *Th*1 and *Th*2 each including a so-called primary element designated P1 and P2, which is basically a resistive element capable of dissipating heat when current is flowing through it, and a so-called secondary element designated S1 and S2. The secondary elements may be any of various circuit elements having a conductivity varying temperature, and it is assumed in connection with FIG. 1 that the elements S1 are semiconductor (NTC) resistors having a high negative temperature coefficient of resistance. In each thermal coupling unit, the primary and secondary elements are in close thermal coupled relation, this relationship being symbolically indicated by the dashed circle. Thus, when current is flowing through the primary element P1 or P2, the primary element dissipates heat and elevates the temperature of the associated secondary element S1 or S2. The conductance of the secondary element then changes and, if as here assumed the secondary element is an NTC resistance, its conductance will increase.

As shown, both primary elements P1 and P2 have one end connected to a related output C and D respectively of the bistable circuit and have their other end connected to a suitable voltage source V. Both secondary elements S1 and S2 have their one end connected to the voltage source V and their other end connected to a related input A and B respectively of the bistable circuit. Inputs A and B are here shown connected through equal resistors to ground. The operation of the system is straightforward.

Assume that initially output C of the bistable circuit is deenergized, i.e. at substantially ground potential, and output D is energized at substantially the source potential V. Current flows through the upper primary element P1 but does not flow substantially through the lower primary element P2. Element P1 generates heat, elevating the temperature of the associated secondary element S1. The conductance of element S1 therefore increases while that of element S2 remains low. Source voltage is therefore applied through the heated element S1 to the input A of the bistable circuit but not to input B. This switches the bistable circuit to the state wherein its output C is energized and output D deenergized. Hence current flow through the upper primary element P1 is arrested and current flow through the lower primary element P2 is initiated. Upper secondary element S1 rapidly cools and its transconductance falls to its low normal value, whereas the lower secondary element S2 now heats and its conductance rises. When the conductance of element S2 reaches a determined value the voltage applied through it to the B input of the bistable circuit switches the latter to the state initially considered, where C is deenergized, thereby initiating a fresh operating semi-cycle of the system, similar to but reverse from the one described above.

Figure 3:
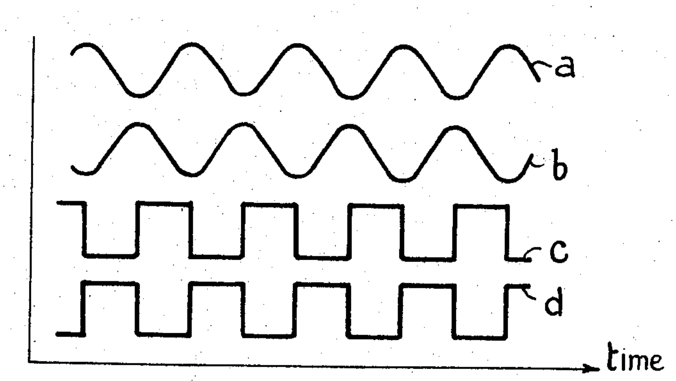
FIG. 3 shows a set of signal waveforms appearing at various points of each of the circuits of FIGS. 1 and 2.

It will thus be apparent that the circuit of FIG. 1 constitutes an oscillator, somewhat analogous in operation to that of a conventional relaxation generator but utilizing "thermal capacity" instead of the conventional electrical capacitance action. The signal waveforms derivable from such a generator are illustrated in FIG. 3, where the four waveforms *a*, *b*, *c* and *d* represent typical voltages derivable from the terminals A, B, C and D in FIG. 1. It will be noted that the waveforms *c* and *d* tapped from the outputs of the bistable circuit F are square pulses whose shape depends only on the switching characteristics of the circuit, not on the laws of heat transfer in the thermal coupling units.

The main advantage of such an oscillator lies in the absence of electrical capacitors therein, which capacitors would have to have very large physical dimensions in order to achieve the very low signal frequencies that can be achieved with the oscillator of the invention. The output frequency of such an oscillator is low because it is inherently set by the low rate of heat transfer in the thermal coupling units, even those units are made extremely small, in the size range used for the components of integrated circuits. The time constant of the heat transfer action in such a thermal coupling unit is found to be approximately proportional to the square of the distance between the primary and secondary elements, and can be controlled with considerable precision over a broad range, say about from 0.1 second to 10 seconds and more. (Output frequency about from 0.1 c.p.s. to 10 c.p.s.)

Figure 2:
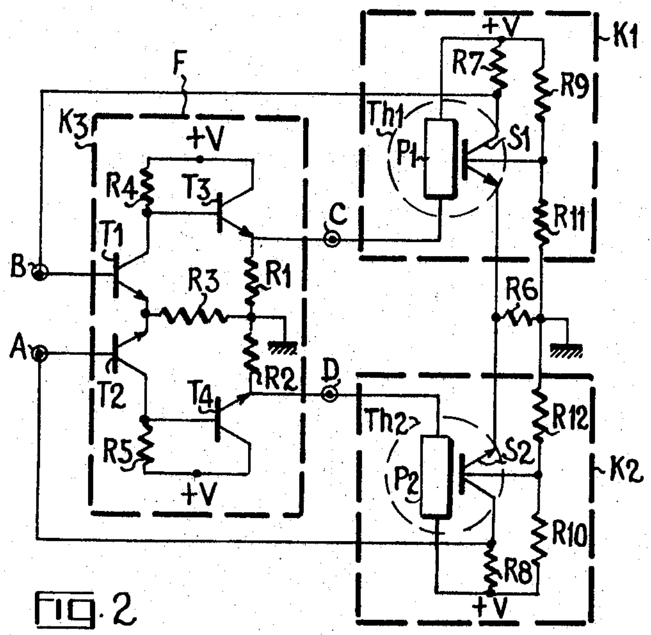
FIG. 2 is a detailed diagram of another embodiment.

In the embodiment of FIG. 2, the bistable circuit F is shown as comprising two input transistors T1, T2 and two output transistors T3, T4 in a cascaded common-emitter arrangement. The emitters of the input transistors T1 and T2 are grounded through a common resistor R3 and the emitters of T3 and T4 are grounded through the equal resistors R1 and R2. The collectors of T1 and T2 are connected to the bases of T3 and T4 respectively, and are biased together with said bases by way of resistors R4 and R5 from the positive voltage source +V, also connected to the collectors of T3 and T4.

With this arangement, and a suitable choice of values for the biassing voltage and resistors (an exemplary set of values will be given later), the application of a positive voltage say at input terminal B to the base of transistor T1 switches the latter to its conductive state (the transistors are assumed of the NPN type). Conduction through T1 lowers the bias voltage on the base of T3 which is thereupon switched off. The output terminal C, connected to the emitter of T3, is then at a relatively low or ground potential, while output terminal D is at its initial source potential (V). In the absence of a positive voltage at input terminal A, T1 is off, T3 is on, and output terminal C as at the relatively high potential of source +V, while terminal D is at low potential. It will be noted that owing to the two-stage action of the cascaded transistors in the bistable circuit of FIG. 2, the relationship between the inputs and outputs is reverse from the one assumed in FIG. 1, and for this reason the inputs A and B have been shown reversely positioned.

The output terminals C and D are connected to first ends of the respective primary elements P1 and P2, such as resistors, having their other ends connected to the common positive source voltage +V. The secondary elements S1 and S2, in thermally coupled relation with the primary elements, are here shown as transistors. The transistors S1 and S2 have their emitters grounded through the common resistor R6, their collectors biassed from the source through resistors R7 and R8, and their bases biassed by being connected to the intermediate junctions of respective voltage dividers including the resistors R9 and R10 connected to the source and resistors R11 and R12 connected to ground.

It may be observed that the arrangement described constitutes a balanced differential amplifier. If it is first assumed that both transistors S1 and S2 are at ordinary temperature, then both transistors have equal or approximately equal transconductances, and their collector terminals apply substantially equal voltages to the inputs A and B of the bistable circuit F. Assume now that in the bistable circuit F, output transistor T3 is "on" and output transistor T4 is "off." Output terminal C is at a relatively high potential and output terminal D at a low one. Current commences to flow through primary element P2 connected to the D-output, and the temperature of that element rises, raising the temperature of the transistor S2 thermally coupled to it. As the temperature of transistor S2 rises its transconductance increases, and the potential of its collector terminal drops, reducing the voltage applied at input terminal A to the base of transistor T2. After a time delay determined by the power rating of the primary elements P1 and P2 and the closeness of the heat coupling between them and transistors S1 and S2, the negative swing at input terminal A is sufficient to turn transistor T2 off and thus switch the bistable circuit F to its other stable state in which its output transistor T4 is "on" and output transistor T3 "off." Output C is now brought to a low potential and output D to a high one. Elements P1 and S1 now begin to heat while elements P2 and S2 cool off, initiating a new operating semi-cycle.

It can thus be seen that the circuit of FIG. 2 operates as a low-frequency generator similar to the one described with reference to FIG. 1. The voltages derivable from the terminals A, B, C and D are again similar to the waveforms *a*, *b*, *c* and *d* respectively shown in FIG. 3.

Figure 4:
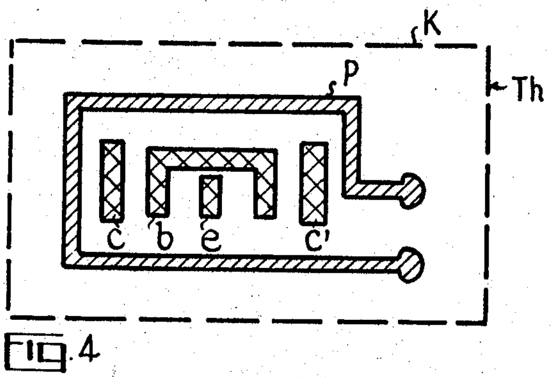
FIG. 4 is an enlarged front view of a thermal-coupling unit according to one form of the invention, formed on a silicon single-crystal wafer.

The systems of the invention are especially suitable for embodiment by integrated-circuit microelectric techniques. FIG. 4 illustrates one practical embodiment of a thermal-coupling unit, of the kind schematically indicated as the circles T*h*1 and T*h*2 in FIG. 2, each such unit including a heating or primary element P1 or P2, and a heated or secondary element S1 or S2 thermally coupled with it. The thermal coupling unit T*h* shown in FIG. 4 is constructed by the so-called "Planar" integrated-circuit techniques and includes a silicon single-crystal wafer partly shown as *k*, having the transistor S1 or S2 formed in it by conventional high-temperature diffusion and photolithographic or equivalent methods. Said transistor is shown by its emitter contact *e*, its base contact *b* and its collector contacts *c* and *c'*. Formed in the wafer *k* so as to surround the transistor elements closely is the heating resistor P, which in this embodiment constitutes the primary or heating element designated P1 or P2 in FIG. 2. As indicated in dashed lines in FIG. 2, the entire generator circuit may be constructed from three silicon single-crystal wafers, there designated *k*1, *k*2 and *k*3. The wafers *k*1 and *k*2 would each be similar to the wafer designated *k* in FIG. 4 except that in addition to the components of the thermal-coupling unit T*h* just described, each wafer would further have formed thereon the associated biasing resistors such as R7, R9, R11. The third wafer *k*3 would constitute the integrated bistable circuit F.

Figure 5:
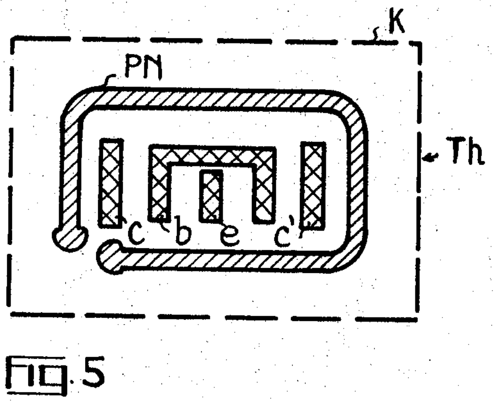
FIG. 5 is a view similar to FIG. 4 illustrating a modified form of thermal coupling unit.

In FIG. 5, the integrated thermal-coupling unit T*h* differs from the one shown in FIG. 4 by the nature of the primary or heating element used. In this case, said element (designated P1 or P2 in FIG. 2) instead of being a semi-conductive resistor as in FIG. 4, is provided by a PN junction formed in the silicon single-crystal *k*. The PN junction is arranged in close surrounding relationship about the transistor elements. Such a PN junction may be connected in the circuit of FIG. 2 as each of the primary elements P1 and P2 in such a manner as to be forward biased. Alternatively the PN junction may be reverse-biased at a suitable value to place it in its reverse avalanche region of operation.

In a prototype embodiment of a generator constructed in accordance with FIG. 2, the following circuit elements were used. In the bistable circuit section F, the transistors T1, T2, T3, T4 were transistors of a conventional convenient type. The source voltage V=5.2 volts D.C. The biassing resistors were as follows: R1=R2=2000 ohms, R3=1000 ohms, and R4=R5=300 ohms. In the differential amplifier section, the biassing resistors had the following values: R6=1000 ohms, R7=R8=300 ohms, R9=R10=330 ohms, and R11=R12=1000 ohms. The transistors S1 and S2, and the resistors P1 and P2 were mounted to simulate an integrated circuit with corresponding dissipation rate. In different tests, the resistors were arranged at varying distances from the associated transistors to vary the thermal coupling, and the output frequency of the generator was thus varied over the previously indicated range. Good frequency stability was obtained in the indicated range.

In a thermal-coupling wafer constructed in accordance with FIG. 4, the over-all dimensions of the rectangle encompassed by the resistor P are about 100 microns and 50 microns and the spacing between the resistance P and the associated transistor elements is in the approximate range of 10 microns, depending on the desired frequency.

It will be understood that various modifications may be made in the embodiments shown and described without departing from the scope of the invention. Thus, integrated thermal-coupling units analogous to those shown in FIGS. 4 and 5 may be constructed in which the transistor portion of the circuit is replaced with one or more semi-conductive (NTC) resistors, or rectifier junctions, for use in an embodiment similar to that of FIG. 1. Alternatively, the heating and heated elements such as P1 and S1 may be provided in the form of wire coils, preferably wound in coaxial relation with the primary winding surrounding the secondary winding. Yet other arrangements may be used. The two-state circuit F may likewise assume a variety of forms.

The invention may in fact in some cases be embodied with the use of but a single thermal-coupling unit instead of the two such units shown in each of FIGS. 1 and 2. The bistable circuit F would then be replaced by a simple switching circuit such as a switching transistor.

In each of the embodiments shown in FIGS. 1 and 2, an amplifier stage may be connected between each output of the bistable circuit section F and the related primary element P1 or P2, should this be found desirable.

While in the embodiments shown the circuit arrangement was such that each of the primary elements (P1 and P2) conducted current in the deenergized condition of the bistable circuit output connected to it, a reverse arrangement may be adopted wherein current flows through each primary element when the output connected to it is energized.

What I claim is:

1. A device for generating periodic signals comprising:
a bistable circuit having a pair of inputs and a pair of outputs and switchable to either of two stable states in which one output is at an active potential and the other output at an inactive potential on application of a prescribed voltage level to each of said inputs;
a pair of thermal coupling units each comprising:
a heat-dissipating primary element and a secondary element in thermally coupled relation therewith and having a first conductive condition at a non-elevated temperature and a second conductive condition at elevated temperature;
means connecting said bistable circuit outputs to the primary elements of respective ones of said units including means for passing substantial current through each primary element to dissipate heat therefrom when the output connected thereto is at said active potential but not when said connected output is at said inactive potential; and
means connecting the secondary elements of said coupling units back to said respective bistable circuit inputs including means for applying said prescribed voltage level to each input when the secondary element connected thereto is in one of its conductive conditions but not in the other, whereby to switch the bistable circuit alternately between its two stable states and whereby periodic signals will appear at said inputs and outputs of said circuit.

2. A device for generating periodic signals comprising:
a switching circuit having an input and an output and switchable to a first output state on application of a first voltage condition to its input and to a second output state on application of a second voltage condition to its input;
a thermal-coupling unit comprising:
a heat-dissipating primary element and
a secondary element in thermally coupled relation therewith and having a first conductive condition at a non-elevated temperature and a second conductive condition at elevated temperature;
means connecting said switching circuit output to said primary element including means for passing substantial current through the primary element to dissipate heat therefrom in said first output state but not in said second output state of the circuit; and
means connecting said secondary element back to said switching circuit input including means for applying said first voltage condition to said input when said secondary element is in said first conductive condition and applying said second voltage condition to said input when the secondary element is in said second conductive condition;
whereby periodic signals will appear at said input and output.

3. The device defined in claim 2, wherein said primary element is a resistor.

4. The device defined in claim 2, wherein said primary element is a semi-conductor rectifier junction.

5. The device defined in claim 2, wherein said secondary element is a negative temperature coefficient resistor.

6. The device defined in claim 2, wherein said secondary element is a transistor.

7. The device defined in claim 2, wherein the primary and secondary elements are formed as an integrated circuit on a common semi-conductive single-crystal.

8. In an electronic circuit utilizing thermal coupling, an integrated thermal coupling unit comprising:
a single crystal of semi-conductive material;
a variable-conductance element formed in said single crystal;
a resistive element formed in said single crystal around said variable-conductance element in thermally-coupled relation therewith; and
means for connecting said elements to external circuitry;
whereby current flow through said resistive element will dessipate heat into the semi-conductive material of the single crystal to vary the conductance of said variable-conductance element.

9. A thermal coupling unit according to claim 8, wherein said variable-conductance element is a transistor.

10. A thermal coupling unit according to claim 8, wherein said resistive element is a semi-conductive resistor.

11. A thermal coupling unit according to claim 8, wherein said resistive element comprises a semi-conductive rectifier junction.

12. A low-frequency oscillator circuit comprising:
a bistable circuit section having two inputs and two outputs;

a balanced amplifier section having two similar transistors connected to a common voltage source for deriving variable output voltages therefrom at an output of each of said transistors;

a connection from each of said transistor outputs to a related input of the bistable circuit section;

a pair of heating elements arranged in close thermally coupled relation with the respective transistors whereby current flow through each heating element will elevate the temperature of the related transistor and vary the variable voltage derived at the output thereof; and means connecting the respective heating elements with the outputs of the bistable circuit section and with said voltage source, whereby oscillatory switching of said bistable circuit section between its two stable states will cause current flow through the respective heating elements alternately and will alternately vary said output voltages to sustain the oscillatory switching of said bistable circuit section.

No references cited.

ROY LAKE, *Primary Examiner.*

J. KOMINSKI, *Assistant Examiner.*